(12) United States Patent
Seki et al.

(10) Patent No.: US 10,109,816 B2
(45) Date of Patent: Oct. 23, 2018

(54) PROTECTIVE SHEET, DISPLAY UNIT, AND ELECTRONIC APPARATUS

(71) Applicant: JOLED Inc., Tokyo (JP)

(72) Inventors: Takahiro Seki, Tokyo (JP); Michitoshi Tsuchiya, Tokyo (JP); Makoto Noda, Tokyo (JP)

(73) Assignee: JOLED Inc., Tokyo (JP)

( * ) Notice: Subject to any disclaimer, the term of this patent is extended or adjusted under 35 U.S.C. 154(b) by 0 days.

(21) Appl. No.: 15/440,825

(22) Filed: Feb. 23, 2017

(65) Prior Publication Data

US 2017/0263889 A1 Sep. 14, 2017

(30) Foreign Application Priority Data

Mar. 8, 2016 (JP) ................................. 2016-044217

(51) Int. Cl.
*H01L 51/52* (2006.01)
*H01L 51/00* (2006.01)
(Continued)

(52) U.S. Cl.
CPC .... *H01L 51/5253* (2013.01); *G02F 1/133305* (2013.01); *G02F 1/133345* (2013.01); *H01L 51/0097* (2013.01); *H04M 1/03* (2013.01); *H04M 1/185* (2013.01); *G02F 1/13338* (2013.01); *G02F 1/133528* (2013.01); *G02F 2001/133331* (2013.01); *G02F 2201/50* (2013.01); *G02F 2201/503* (2013.01); *G02F 2413/02* (2013.01); *G02F 2413/03* (2013.01); *H01L 27/323* (2013.01); *H01L 27/3244* (2013.01); *H01L 51/5281* (2013.01); *H01L 2251/5338* (2013.01); *H04M 1/0266* (2013.01)

(58) Field of Classification Search
CPC ........... H01L 2251/5338; H01L 27/323; H01L 51/5253; G02F 1/133305; G02F 1/133345; G02F 2201/503
See application file for complete search history.

(56) References Cited

U.S. PATENT DOCUMENTS

2014/0065326 A1* 3/2014 Lee ........................... G06F 1/16
428/12
2016/0355000 A1* 12/2016 Matsushima ........... B32B 27/30

FOREIGN PATENT DOCUMENTS

| JP | 2009-037119 A | | 2/2009 |
| JP | 2009037119 A | * | 2/2009 |
| JP | 2015-105993 A | | 6/2015 |

\* cited by examiner

*Primary Examiner* — David Spalla
(74) *Attorney, Agent, or Firm* — Michael Best & Friedrich LLP (57) ABSTRACT

A display unit includes a display panel and a first protective sheet. The display panel has a light-emitting surface. The first protective sheet is provided on the light-emitting surface. The first protective sheet provided in the display unit includes a first impact dispersion layer, a first strain relaxation layer, and a gel-like first impact absorption layer. The first impact dispersion layer has a pencil hardness of 3H or higher. The first strain relaxation layer has flexural strength and tensile strength both higher than the flexural strength and the tensile strength of the first impact dispersion layer. The gel-like first impact absorption layer has a thickness of a submillimeter order or more. The first impact absorption layer, the first strain relaxation layer, and the first impact dispersion layer are arranged in this order from the light-emitting surface.

9 Claims, 7 Drawing Sheets

(51) Int. Cl.
*G02F 1/1333* (2006.01)
*H04M 1/03* (2006.01)
*H04M 1/18* (2006.01)
G02F 1/1335 (2006.01)
H01L 27/32 (2006.01)
H04M 1/02 (2006.01)

PROTECTIVE SHEET, DISPLAY UNIT, AND ELECTRONIC APPARATUS

CROSS REFERENCE TO RELATED APPLICATIONS

The present application claims priority from Japanese Patent Application No. 2016-044217 filed on Mar. 8, 2016, the entire contents of which are hereby incorporated by reference.

BACKGROUND

The disclosure relates to a protective sheet, a display unit, and an electronic apparatus.

External impact may sometimes leave a flaw on a surface of a display or break the inside of the display, and thereby impair functions thereof. In particular, a flexible display has low impact resistance, while it has features of thinness, lightness, and flexibility. In order to improve the impact resistance of the display, toughened glass has been joined to the surface of the display, which, however, has caused increased weight and increased thickness. Further, when the toughened glass is joined to the surface of the flexible display, the features of thinness, lightness, and flexibility are impaired. Thus, various protective sheets have been proposed that protect the surface of the display without using the toughened glass, as disclosed in Japanese Unexamined Patent Application Publications No. 2015-105993 and No. 2009-037119, for example.

SUMMARY

It has been requested even today that a protective sheet provided on a display absorb external impact while suppressing occurrence of a crack without using toughened glass.

It is desirable to provide a protective sheet that makes it possible to absorb external impact while suppressing the occurrence of a crack without using toughened glass, a display unit including such a protective sheet, and an electronic apparatus.

A protective sheet according to an embodiment of the disclosure is a protective sheet that protects a light-emitting surface of a display panel. The protective sheet includes a first impact dispersion layer, a first strain relaxation layer, and a gel-like first impact absorption layer. The first impact dispersion layer has a pencil hardness of 3H or higher. The first strain relaxation layer has flexural strength and tensile strength both higher than the flexural strength and the tensile strength of the first impact dispersion layer. The gel-like first impact absorption layer has a thickness of a submillimeter order or more. The first impact absorption layer, the first strain relaxation layer, and the first impact dispersion layer are arranged in this order.

A display unit according to an embodiment of the disclosure includes a display panel and a first protective sheet. The display panel has a light-emitting surface. The first protective sheet is provided on the light-emitting surface. The first protective sheet provided in the display unit according to the embodiment of the disclosure includes a first impact dispersion layer, a first strain relaxation layer, and a gel-like first impact absorption layer. The first impact dispersion layer has a pencil hardness of 3H or higher. The first strain relaxation layer has flexural strength and tensile strength both higher than the flexural strength and the tensile strength of the first impact dispersion layer. The gel-like first impact absorption layer has a thickness of a submillimeter order or more. The first impact absorption layer, the first strain relaxation layer, and the first impact dispersion layer are arranged in this order from the light-emitting surface.

An electronic apparatus according to an embodiment of the disclosure is provided with a display unit. The display unit includes a display panel and a first protective sheet. The display panel has a light-emitting surface. The first protective sheet is provided on the light-emitting surface. The first protective sheet provided in the display unit according to the embodiment of the disclosure includes a first impact dispersion layer, a first strain relaxation layer, and a gel-like first impact absorption layer. The first impact dispersion layer has a pencil hardness of 3H or higher. The first strain relaxation layer has flexural strength and tensile strength both higher than the flexural strength and the tensile strength of the first impact dispersion layer. The gel-like first impact absorption layer has a thickness of a submillimeter order or more. The first impact absorption layer, the first strain relaxation layer, and the first impact dispersion layer are arranged in this order from the light-emitting surface.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

(A) of FIG. 6 is a distribution diagram of strain of a display unit according to a comparative example, whereas (B) of FIG. 6 is a distribution diagram of strain of the display unit illustrated in FIG. 1.

DETAILED DESCRIPTION

Some example embodiments of the disclosure are described below in detail, in the following order, with reference to the accompanying drawings.

1. Embodiment (display unit)
2. Modification Examples (display unit)
3. Application Example (electronic apparatus)

[1. Embodiment]
[Configuration]

Figure 1:
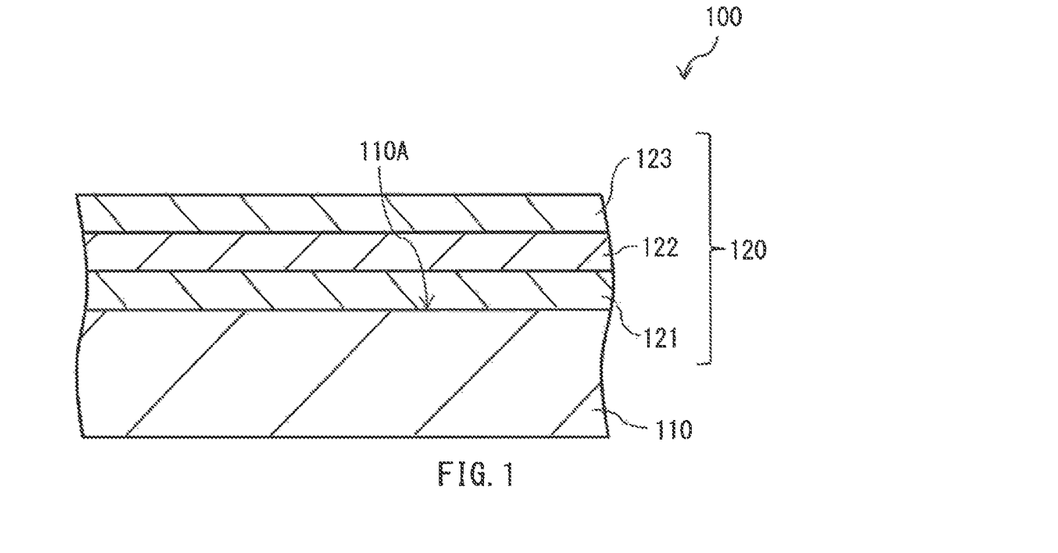
FIG. 1 illustrates an example of a cross-sectional configuration of a display unit according to an embodiment of the disclosure.

FIG. 1 illustrates an example of a cross-sectional configuration of a display unit 100 according to an embodiment of the disclosure. The display unit 100 includes a display panel 110 and a protective sheet 120. The display panel 110 has a light-emitting surface 110A. The protective sheet 120 is provided on the light-emitting surface 110A of the display panel 110. The display panel 110 may include a plurality of display pixels disposed two-dimensionally below the light-emitting surface 110A, and may generate image light L using light emitted from each of the display pixels. A driver that drives the plurality of display pixels may be mounted in an outer peripheral region of the display panel 110. The display unit 100 may be provided with a controller that controls the display panel 110, and may control the display panel 110 on the basis of a control signal supplied from the controller.

(Display Panel 110)

The display panel 110 may generate the image light L on the basis of the control signal supplied form the controller, and may emit the generated image light L to the outside through the light-emitting surface 110A. The display panel 110 may be, for example, an organic electro luminescence (EL) panel, or a liquid crystal panel. It is to be noted that the display panel 110 is not limited to the organic EL panel or the liquid crystal panel, and may be a display panel of another type.

Figure 2:
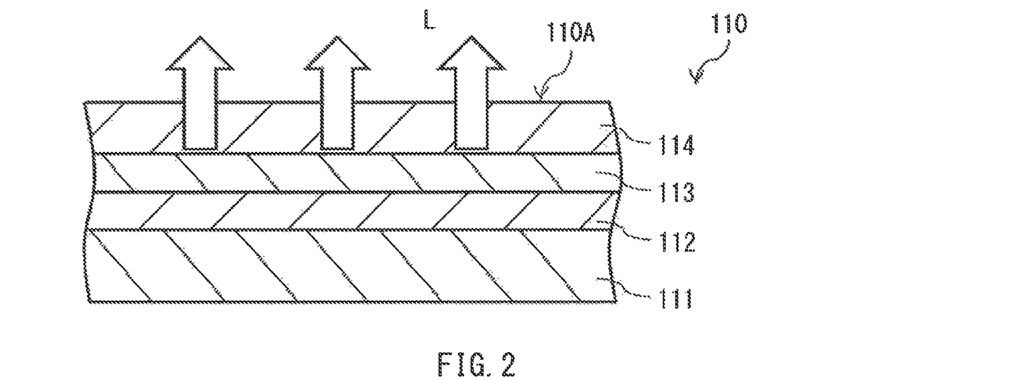
FIG. 2 illustrates an example of a cross-sectional configuration of a display panel illustrated in FIG. 1.

FIG. 2 illustrates an example of a cross-sectional configuration of the display panel 110. The display panel 110 illustrated in FIG. 2 is a top emission organic EL panel. As illustrated in FIG. 2, the display panel 110 may include a device-forming substrate 111, a thin film transistor (TFT) layer 112, an organic layer 113, and a sealing substrate 114, for example. The device-forming substrate 111, the TFT layer 112, the organic layer 113, and the sealing substrate 114 may be disposed in this order toward the light-emitting surface 110A. For example, a surface of the sealing substrate 114 may serve as the light-emitting surface 110A. The device-forming substrate 111 may be a substrate used for forming, thereon, the TFT layer 112 and the organic layer 113, and may be made of a glass substrate or a plastic substrate, for example.

Examples of the glass substrate may include high strain point glass, soda lime glass ($Na_2O.CaO.SiO_2$), borosilicate glass ($Na_2O.B_2O_2.SiO_2$), forsterite glass ($2MgO.SiO_2$), and lead glass ($Na_2O.PbO.SiO_2$). Examples of the plastic substrate may include a substrate made of an organic polymer such as polymethylmethacrylate (PMMA), polyvinyl alcohol (PVA), polyvinyl phenol (PVP), polyether sulfone (PES), polyimide (PI), polycarbonate (PC), polyethylene terephthalate (PET), and triacetyl cellulose (TAC). It is to be noted that the plastic substrate may be a flexible film-like or sheet-like substrate.

The organic layer 113 may be a layer including a plurality of organic EL devices provided for respective display pixels, for example. Light emitted from each organic EL device may form the image light L. The TFT layer 12 may be a layer including a plurality of pixel circuits provided for respective display pixels. Each of the display circuits may control a current flowing into the organic EL device included in the corresponding display pixel. The sealing substrate 114 may seal the plurality of organic EL devices inside the organic layer 113, and may include a color filter or a black matrix, as necessary. The sealing substrate 114 may include a substrate made of the same material as that of the device-forming substrate 111. The sealing substrate 114 may be configured by a polarizing plate. The sealing substrate 114 may be configured by an alternate stack of a low-retardation film and the polarizing plate. The sealing substrate 114 may be removed from the display panel 110.

Figure 3:
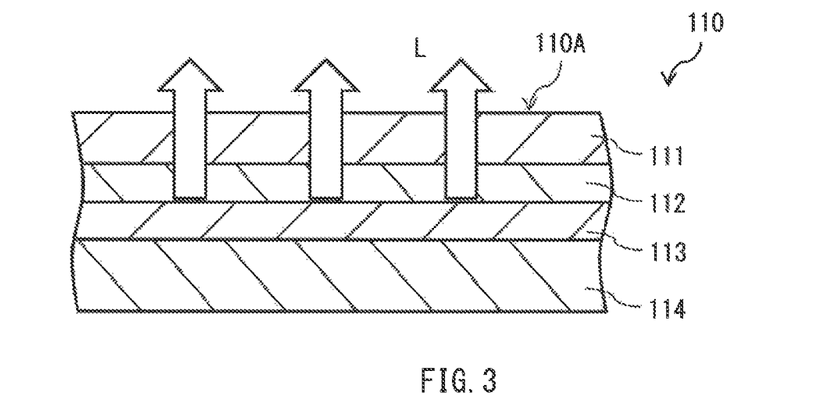
FIG. 3 illustrates an example of a cross-sectional configuration of the display panel illustrated in FIG. 1.

FIG. 3 illustrates an example of a cross-sectional configuration of the display panel 110. The display panel 110 illustrated in FIG. 3 is a bottom emission organic EL panel. As illustrated in FIG. 3, the display panel 110 may include the device-forming substrate 111, the TFT layer 112, the organic layer 113, and the sealing substrate 114, for example. The device-forming substrate 111, the TFT layer 112, the organic layer 113, and the sealing substrate 114 may be disposed in this order from light-emitting surface 110A side. For example, a surface of the device-forming substrate 111 may serve as the light-emitting surface 110A.

In the display panel 110 in FIG. 2 or FIG. 3, the device-forming substrate 111 and the sealing substrate 114 may be each made of a flexible plastic substrate. In this case, the display panel 110 serves as a flexible organic EL panel.

Figure 4:
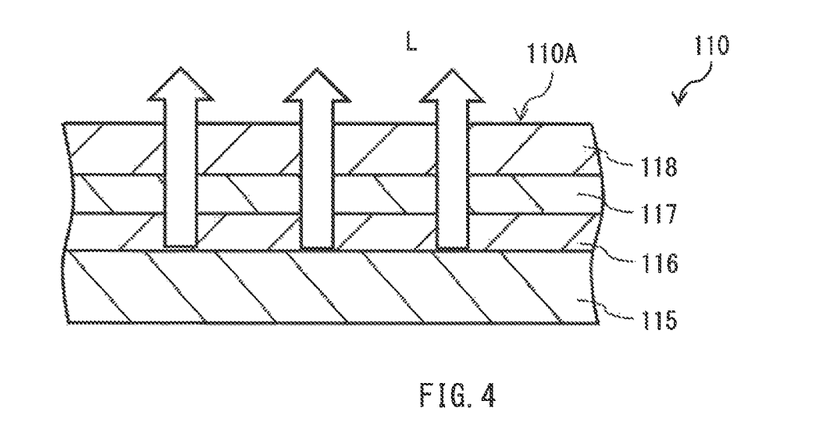
FIG. 4 illustrates an example of a cross-sectional configuration of the display panel illustrated in FIG. 1.

FIG. 4 illustrates an example of a cross-sectional configuration of the display panel 110. The display panel 110 illustrated in FIG. 4 is a liquid crystal panel. As illustrated in FIG. 4, the display panel 110 may include a backlight 115, a polarizing plate 116, a liquid crystal layer 117, and a polarizing plate 118, for example. The backlight 115, the polarizing plate 116, the liquid crystal layer 117, and the polarizing plate 118 may be disposed in this order toward the light-emitting surface 110A. For example, a surface of the polarizing plate 118 may serve as the light-emitting surface 110A. The backlight 115 may supply surface emission light from side of the polarizing plate 116 to a light modulator configured by the polarizing plate 116, the liquid crystal layer 117, and the polarizing plate 118. Each transmission axis of the polarizing plate 116 and the polarizing plate 118 may be set depending on a mode such as a drive mode of the liquid crystal layer 117, and, for example, the transmission axes may be set to have a crossed Nicols relationship. The liquid crystal layer 117 may control transmittance of light transmitted through the liquid crystal layer 117 in response to an applied voltage. The liquid crystal layer 117 may include a liquid crystal to be driven for display by, for example, a vertical alignment (VA) mode, a twisted nematic (TN) mode, an electrically-controlled birefringence (ECB) mode, a fringe-field switching (FFS) mode, or an in-plane switching (IPS) mode.

(Protective Sheet 120)

The protective sheet 120 may protect the light-emitting surface 110A of the display panel 110. The protective sheet 120 may be further configured by a flexible sheet having a light-transmissivity to the image light L. As illustrated in FIG. 1, the protective sheet 120 includes the impact absorption layer 121, the strain relaxation layer 122, and the impact dispersion layer 123, for example. The impact absorption layer 121, the strain relaxation layer 122, and the impact dispersion layer 123 may be disposed in this order from the light-emitting surface 110A side. The impact absorption layer 121 may be disposed closest to the light-emitting surface 110A, among the impact absorption layer 121, the strain relaxation layer 122, and the impact dispersion layer 123. The impact dispersion layer 123 may be disposed most distant from the light-emitting surface 110A, among the impact absorption layer 121, the strain relaxation layer 122, and the impact dispersion layer 123. The strain relaxation layer 122 may be disposed between the impact absorption layer 121 and the impact dispersion layer 123.

(Impact Dispersion Layer 123)

The impact dispersion layer 123 may have functions of dispersing impact applied from outside not to concentrate on one point and of preventing occurrence of a flaw on a surface thereof due to causes such as a scratch. The impact dispersion layer 123 may be made of a resin film having a pencil hardness of 3H or higher. The pencil hardness "H" as used herein refers to the hardness measured in compliance with JIS K5600 standard according to the Japanese Industrial Standards (JIS). The upper limit of the hardness of the impact dispersion layer 123 is not particularly limited. The impact dispersion layer 123 may be made of a resin film having a pencil hardness of 10H or lower, for example. In order to enhance the hardness of the resin film, it is common to apply or perform vapor deposition of a hard coat material on a surface of a film base material. However, when performing a hard coat treatment on a single surface of the film base material, a warp is likely to occur to the film base material, thus making a joining process likely to be difficult. Further, when joining a film base material having undergone the hard coat treatment on the single surface (hereinafter, referred to as "single surface hard coat (HC) treatment film"), the joined resin film may be sometimes cracked or warped due to residual stress. Therefore, the impact dispersion layer 123 may be preferably made of a hard coat material hardened into a film (hereinafter, referred to as "hard coat (HC) film") or a film base material having undergone the hard coat treatment on both surfaces to be formed into a film (hereinafter, referred to as "double surface hard coat (HC) treatment film").

The HC film and the double surface HC treatment film may have less occurrence of a warp, thus making it possible to achieve desired pencil hardness, Young's modulus, and thickness. Therefore, the HC film and the double surface HC treatment film are suitable as the impact dispersion layer 123.

Figure 5:
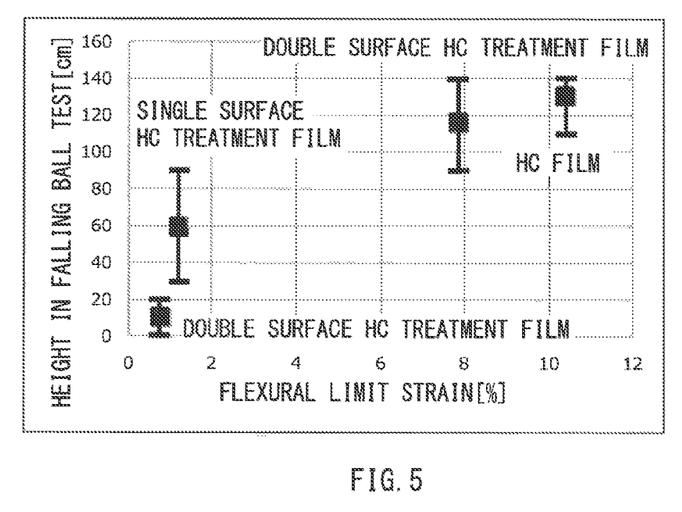
FIG. 5 illustrates experimental results of flexural fracture strain and height for fracture in a falling ball test for four types of films.

Selecting a material resistant to bending for the impact dispersion layer 123 enhances the impact resistance in a falling ball test. FIG. 5 illustrates experimental results of flexural fracture strain and height for fracture in the falling ball test for four types of the HC films (single surface HC treatment film, double surface HC treatment film, and HC film). It is appreciated from FIG. 5 that a film having high flexural fracture strain tends to also have increased fracture limit height in the falling ball test. From the viewpoint of suppressing a crack in the impact dispersion layer 123, the impact dispersion layer 123 may be preferably made of the HC film having a flexural fracture strain of 4% or higher or the double surface HC treatment film having a flexural fracture strain of 4% or higher.

(Impact Absorption Layer 121)

The impact absorption layer 121 may have a function of absorbing external impact (impact-absorbing function) by deformation of the impact absorption layer 121 in accordance with a curvature generated in the impact dispersion layer 123 when the impact dispersion layer 123 receives the impact. The impact absorption layer 121 may be a gel-like resin layer having a thickness of a submillimeter order or more. The gel-like resin layer configuring the impact absorption layer 121 may preferably have an Asker C hardness of 30 or more and 80 or less. The "Asker C hardness" as used herein refers to the hardness measured by Asker C durometer available from Kobunshi Keiki Co., Ltd., located in Kyoto, Japan, in compliance with Standard SRIS 0101 of the Society of Rubber Science and Technology, Japan. When the Asker C hardness is less than 30, the impact absorption layer 121 may be crushed by the impact, leading to a possibility that the impact may not be sufficiently absorbed. Further, when the Asker C hardness is more than 80, the gel deformation upon application of the impact may be small, leading to a possibility that the impact may not be sufficiently absorbed. In the present embodiment, the provision of the impact dispersion layer 123 allows the impact absorption layer 121 to have a thickness less than a thickness necessary as the impact absorption layer 121 (e.g., about 2 mm) when no impact dispersion layer 123 is provided.

The impact absorption layer 121 may be a gel-like bonding layer. In this case, the impact absorption layer 121 may have a function of directly or indirectly joining the protective sheet 120 to the light-emitting surface 110A (joining function). When the impact absorption layer 121 is the gel-like bonding layer, the impact absorption layer 121 may be made of an acrylic gel-like adhesive, for example. A possible candidate for the gel-like adhesive may be a silicone gel. However, the silicone gel has a possibility of oil leaking out, leading to a concern that reliability of a display may be lowered.

(Strain Relaxation Layer 122)

The strain relaxation layer 122 may be provided for enhancing crack resistance of the impact dispersion layer 123 against a load. Even when using a member having high bending resistance for the impact dispersion layer 123, presence of a very soft impact absorption layer 121 below the impact dispersion layer 123 may cause the impact dispersion layer 123 to be flexed largely due to a load, leading to a possibility that the impact dispersion layer 123 may exceed flexural fracture strain to be cracked. Therefore, in the present embodiment, the strain relaxation layer may be interposed between the impact dispersion layer 123 and the impact absorption layer 121 in order to enhance the crack resistance of the impact dispersion layer 123 against a load.

The strain relaxation layer 122 is made of a resin film having flexural strength and tensile strength both higher than those of the impact dispersion layer 123. Examples of such a resin film may include a PET film.

Figure 6:
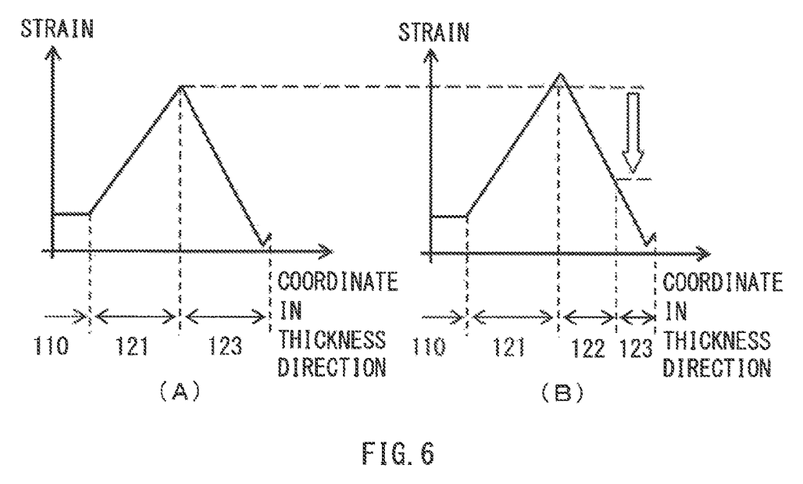

FIG. 6 illustrates results, determined by a stress simulation, of how strain of each layer is distributed by a load from the surface of the protective sheet 120, both in the case where the strain relaxation layer 122 is provided and in the case where no strain relaxation layer 122 is provided. It is appreciated from FIG. 6 that the provision of the strain relaxation layer 122 allows the strain of the impact dispersion layer 123 to be relaxed, thus making the impact dispersion layer 123 less likely to be cracked.

The followings are examples of a combination of the impact dispersion layer 123 and the strain relaxation layer 122.

| | Impact Dispersion Layer 123 | Strain Relaxation Layer 122 |
|---|---|---|
| 1. | Organic/Inorganic Hybrid HC Film | PET |
| 2. | Organic/Inorganic Hybrid HC Film | TAC |
| 3. | Organic/Inorganic Hybrid HC Film | PI |

-continued

|   | Impact Dispersion Layer 123 | Strain Relaxation Layer 122 |
|---|---|---|
| 4. | PET Base Material HC Treatment Film | PET |
| 5. | PET Base Material HC Treatment Film | TAC |
| 6. | PET Base Material HC Treatment Film | PI |
| 7. | TAC Base Material HC Treatment Film | PET |
| 8. | TAC Base Material HC Treatment Film | TAC |
| 9. | TAC Base Material HC Treatment Film | PI |
| 10. | PC Base Material HC Treatment Film | PET |
| 11. | PC Base Material HC Treatment Film | TAC |
| 12. | PC Base Material HC Treatment Film | PI |
| 13. | PMMA Base Material HC Treatment Film | PET |
| 14. | PMMA Base Material HC Treatment Film | TAC |
| 15. | PMMA Base Material HC Treatment Film | PI |

Figure 7:
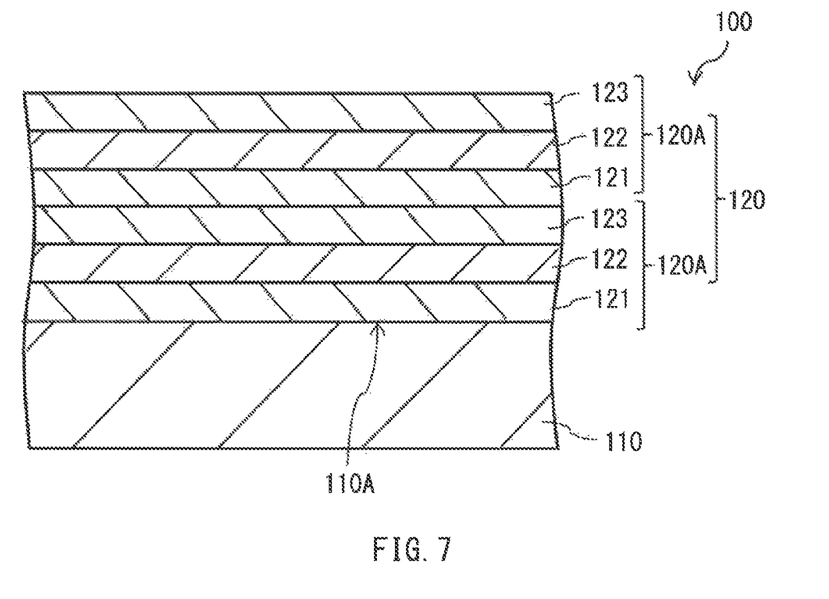
FIG. 7 illustrates a modification example of a cross-sectional configuration of the display unit illustrated in FIG. 1.
Figure 8:
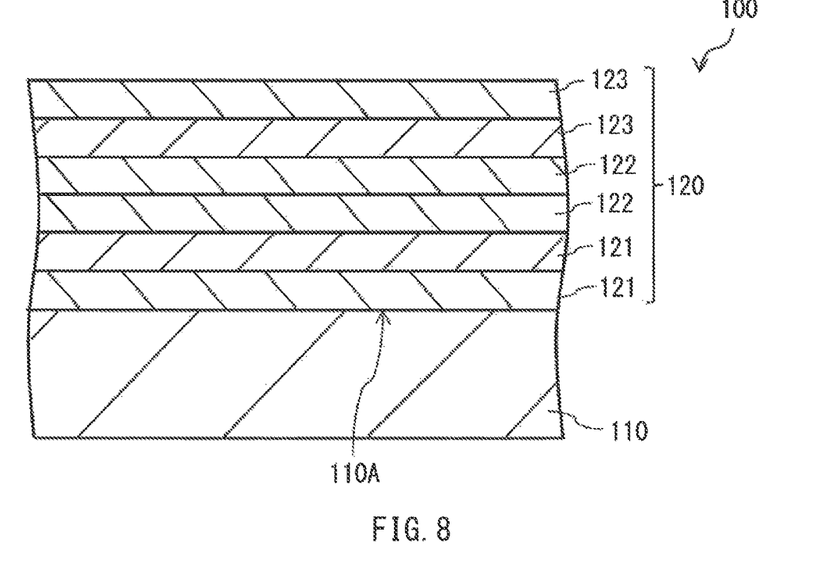
FIG. 8 illustrates a modification example of a cross-sectional configuration of the display unit illustrated in FIG. 1.

HC Film: a hard coat material hardened into a film
Organic/Inorganic Hybrid: a hard coat material in which an organic material and an inorganic material are mixed together
HC Treatment Film: a film base material having undergone a hard coat treatment to be formed into a film
PET Base Material: a film base material made of PET
TAC Base Material: a film base material made of TAC
PC Base Material: a film base material made of PC
PMMA Base Material: a film base material made of PMMA In the above-described example, the protective sheet 120 has a layered structure in which the impact absorption layer 121, the strain relaxation layer 122, and the impact dispersion layer 123 are stacked in this order from display panel 110 side. However, the type of the layered structure in the protective sheet 120 is not limited thereto. As illustrated in FIG. 7, for example, the protective sheet 120 may have a layered structure of a plurality of layered bodies 120A each including the impact absorption layer 121, the strain relaxation layer 122, and the impact dispersion layer 123 which are stacked in this order from the display panel 110 side. Further, as illustrated in FIG. 8, for example, the protective sheet 120 may have a layered structure in which a plurality of impact absorption layers 121, a plurality of strain relaxation layers 122, and a plurality of impact dispersion layers 123 are stacked in this order from the display panel 110 side. In this case, the number of layers of the impact absorption layers 121, the number of layers of the strain relaxation layers 122, and the number of layers of the impact dispersion layers 123 either may be the same as one another, or may be different from one another. By thus increasing the number of layers, it becomes possible to further enhance the impact resistance.

[Effects]

Description is now given of effects of the display unit 100.

External impact may sometimes leave a flaw on a surface of a display or break the inside of the display, and thus impair functions thereof. In particular, a flexible display has low impact resistance, while it has features of thinness, lightness, and flexibility. In order to improve the impact resistance of the display, toughened glass has been joined to the surface of the display, which, however, has caused increased weight and increased thickness. Further, when the toughened glass is joined to the surface of the flexible display, the features of thinness, lightness, and flexibility are impaired.

In contrast, according to the present embodiment, the impact absorption layer 121 provided below the impact dispersion layer 123 is made of a gel-like resin layer having a thickness of a submillimeter order or more. This allows the impact absorption layer 121 to be deformed in accordance with a curvature generated in the impact dispersion layer 123 when the impact dispersion layer 123 receives impact, thus making it possible to absorb the external impact. Note that it is not possible for a bonding layer having thin thickness provided merely for the purpose of adhesion to have such a function.

According to the present embodiment, the strain relaxation layer 122 having flexural strength and tensile strength both higher than those of the impact dispersion layer 123 is provided between the impact dispersion layer 123 and the impact absorption layer 121. This makes it possible to reduce the possibility that the impact dispersion layer 123 may exceed flexural fracture strain to be cracked even when the very soft impact absorption layer 121 is provided below the impact dispersion layer 123. Thus, according to the present embodiment, it is possible to absorb the external impact while suppressing the occurrence of a crack without using the toughened glass.

In the present embodiment, when the impact absorption layer 121 is made of the gel-like bonding layer, it is possible to join the protective sheet 120 directly or indirectly to the light-emitting surface 110A of the display panel 110. This makes it possible to provide the protective sheet 120 on the existing display panel 110 afterward. As a result, the provision of the protective sheet 120 on the existing display panel 110 makes it possible to absorb the external impact while suppressing the occurrence of a crack.

In the present embodiment, when the impact absorption layer 121 is made of the acrylic gel-like bonding layer, oil does not leak out unlike the case of the silicone gel, and thus there is no concern that reliability of a display may be lowered.

In the present embodiment, when the device-forming substrate 111 and the sealing substrate 114 are made of the flexible plastic substrate, and the display panel 110 serves as the flexible organic EL panel, the entire layered body including the display panel 110 and the protective sheet 120 may serve as a flexible display. This makes it possible to enhance the degree of freedom of portability and application, such as carrying the layered body in a folded state, and joining the layered body to a curved wall.

[2. Modification Examples]

Description is given below of a modification example of the display unit 100. It is to be noted that the same numerals are assigned to components common to those of the display unit 100 of the foregoing embodiment. Further, descriptions for the components common to those of the display unit 100 of the foregoing embodiment are omitted where appropriate.

[Modification Example A]

Figure 9:
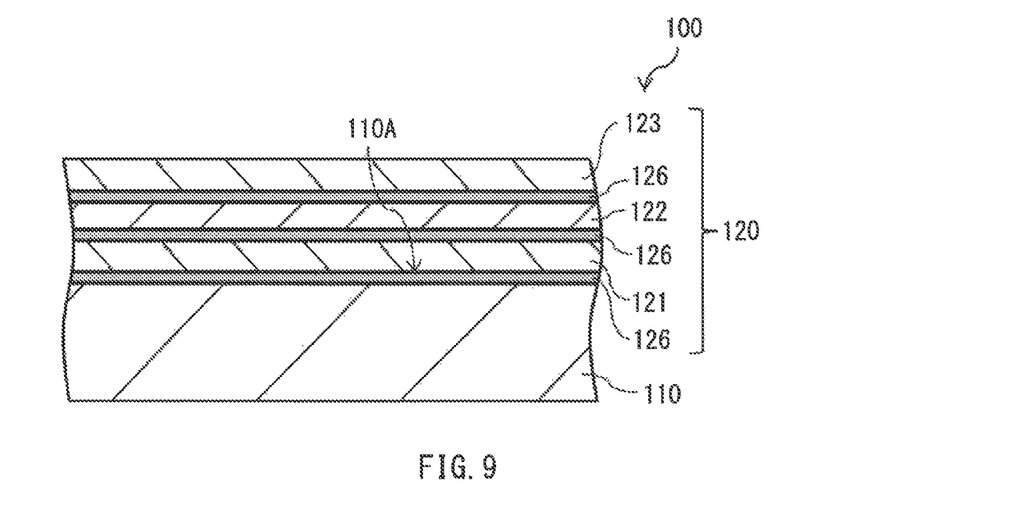
FIG. 9 illustrates a modification example of a cross-sectional configuration of the display unit illustrated in FIG. 1.

In the foregoing embodiment, the impact absorption layer 121, the strain relaxation layer 122, and the impact dispersion layer 123 may be each made of a resin sheet. In this case, as illustrated in FIG. 9, for example, the display unit 100 may be provided with a bonding layer 126 between the impact absorption layer 121 and the display panel 110, between the strain relaxation layer 122 and the impact absorption layer 121, and between the impact dispersion layer 123 and the strain relaxation layer 122.

[Modification Example B]

Figure 10:
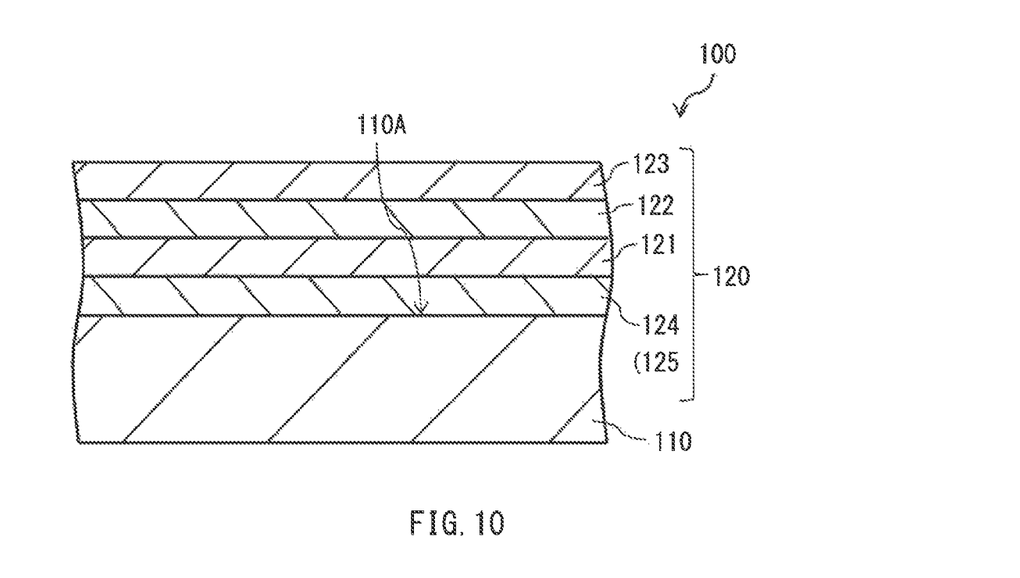
FIG. 10 illustrates a modification example of a cross-sectional configuration of the display unit illustrated in FIG. 1.

In the foregoing embodiment, as illustrated in FIG. 10, the protective sheet 120 may include an optical film 124 or a touch panel 125 including a transparent wiring line between the light-emitting surface 110A and the impact absorption layer 121, for example. Examples of the optical film 124 may include a polarizing plate (e.g., circularly polarizing plate), an anti-glare (AG) film, and a low-reflection (LR) film. The transparent wiring line in the touch panel 125 may be made of a light-transmissive electrically conductive material such as indium tin oxide (ITO). The touch panel 125 including the transparent wiring line is very likely to be cracked, and thus may be preferably disposed below the impact absorption layer 121.

[Modification Example C]

Figure 11:
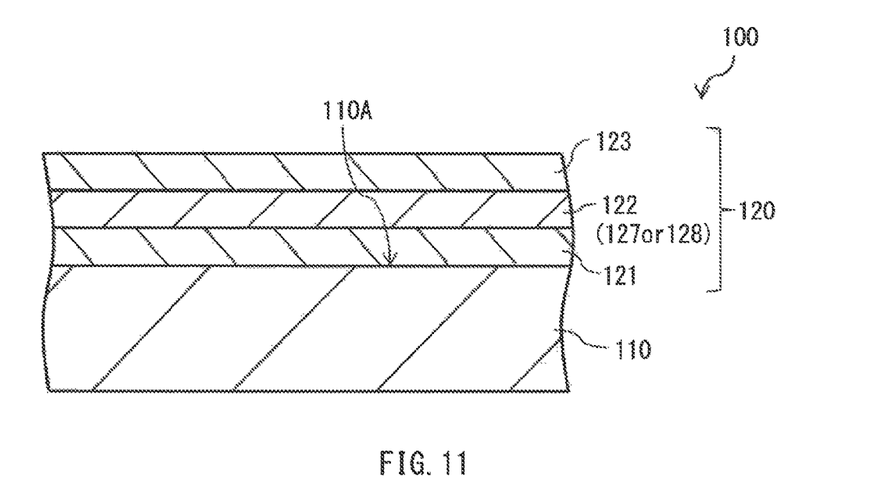
FIG. 11 illustrates a modification example of a cross-sectional configuration of the display unit illustrated in FIG. 1.

In the foregoing embodiment, as illustrated in FIG. 11, the strain relaxation layer 122 may be configured by an optical film 127 such as the polarizing plate, or a touch panel 128 including a metal wiring line such copper (Cu), for example. The touch panel 128 including the metal wiring line may have flexibility and impact resistance higher than those of the touch panel 125 including the transparent wiring line. Therefore, by providing, as the strain relaxation layer 122, the optical film 127 such as the polarizing plate, or the touch panel 128 including the metal wiring line, it becomes possible to decrease the thickness of the protective sheet 120 and to decrease the manufacturing cost.

[Modification Example D]

Figure 12:
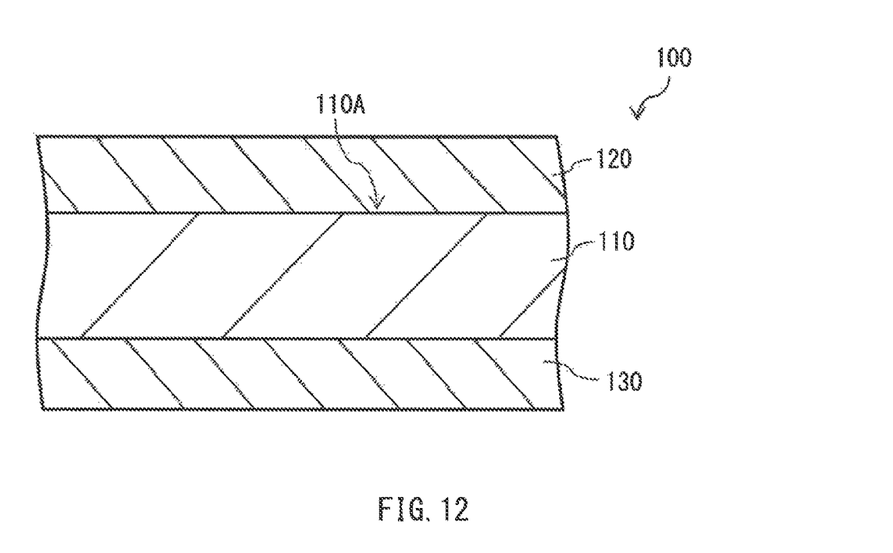
FIG. 12 illustrates a modification example of a cross-sectional configuration of the display unit illustrated in FIG. 1.

In the foregoing embodiment, when the device-forming substrate 111 and the sealing substrate 114 are made of the flexible plastic substrate, and the display panel 110 serves as the flexible organic EL panel, the display unit 100 may be provided with a protective sheet 130 on the rear surface of the display panel 110, for example, as illustrated in FIG. 12. The protective sheet 130 may have functions of enhancing rigidity of the display panel 110 and of reducing local flexure of the display panel 110 upon application of impact to the display panel 110. The protective sheet 130 may be preferably made of a material which has high Young's modulus and is less likely to be plastically deformed, and may be preferably made of, for example, a metal material such as 42Ni (nickel), stainless steel (SUS), a magnesium (Mg) alloy, and aluminum (Al). When the protective sheet 130 is made of the above-mentioned metal material, it is also possible to dissipate heat generated in the display panel 110 out of the protective sheet 130. It is to be noted that the protective sheet 130 may also be made of a resin sheet (e.g., resin sheet such as PET, PI, PC, and PMMA) having the same degree of rigidity as that of the protective sheet 120. Also in this case, the effects similar to those of the protective sheet 120 may be obtained.

[Modification Example E]

Figure 13:
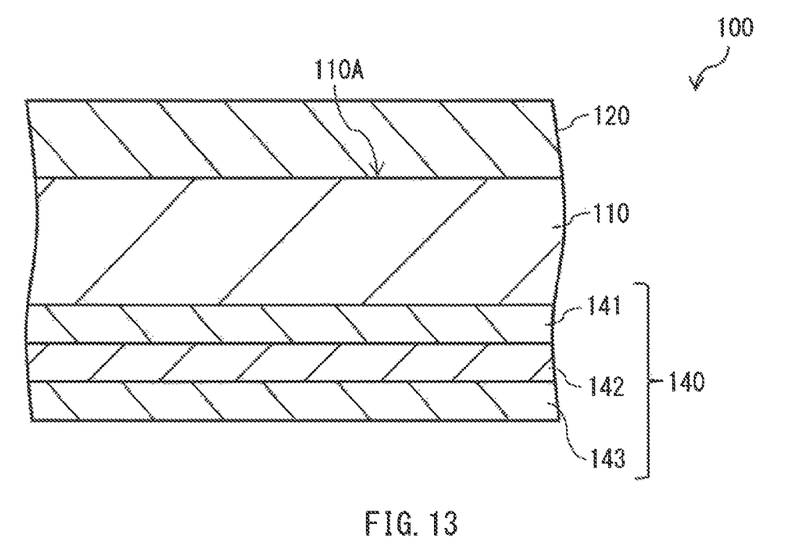
FIG. 13 illustrates a modification example of a cross-sectional configuration of the display unit illustrated in FIG. 1.

In the foregoing embodiment, when the device-forming substrate 111 and the sealing substrate 114 are made of the flexible plastic substrate, and the display panel 110 serves as the flexible organic EL panel, the display unit 100 may be provided with a protective sheet 140 on the rear surface of the display panel 110, for example, as illustrated in FIG. 13. As illustrated in FIG. 10, the protective sheet 140 may include an impact absorption layer 141, a strain relaxation layer 142, and an impact dispersion layer 143, for example. The impact absorption layer 141, the strain relaxation layer 142, and the impact dispersion layer 143 may be disposed in this order from rear surface side of the display panel 110. The impact absorption layer 141 may be disposed closest to the rear surface of the display panel 110, among the impact absorption layer 141, the strain relaxation layer 142, and the impact dispersion layer 143. The impact dispersion layer 143 may be disposed most distant from the rear surface of the display panel 110, among the impact absorption layer 141, the strain relaxation layer 142, and the impact dispersion layer 143. The strain relaxation layer 142 may be provided between the impact absorption layer 141 and the impact dispersion layer 143. The impact absorption layer 141 may have the same configuration as the configuration of the impact absorption layer 121. The strain relaxation layer 142 may have the same configuration as the configuration of the strain relaxation layer 122. The impact dispersion layer 143 may have the same configuration as the configuration of the impact dispersion layer 123.

In the present modification example, the protective sheet 140 provided on the rear surface of the display panel 110 has the configuration common to the protective sheet 120. This allows stress applied to the display panel 110 by the protective sheet 120 and stress applied to the display panel 110 by the protective sheet 140 to offset each other, thus making it possible to prevent the warp or flexure of the display panel 110 caused by the protective sheet 120.

[3. Application Example]

Description is given below of an application example of the display unit 100 described in the foregoing embodiment and Modification Examples A to E (hereinafter, referred to as "the foregoing embodiment and the modification examples"). The display unit 100 according to any of the foregoing embodiment and the modification examples is applicable to display units of electronic apparatuses in any fields that display, as an image or a picture, an image signal input from outside or an image signal generated inside, such as televisions, digital cameras, notebook personal computers, sheet-like personal computers, portable terminal devices such as mobile phones, and video cameras.

Figure 14:
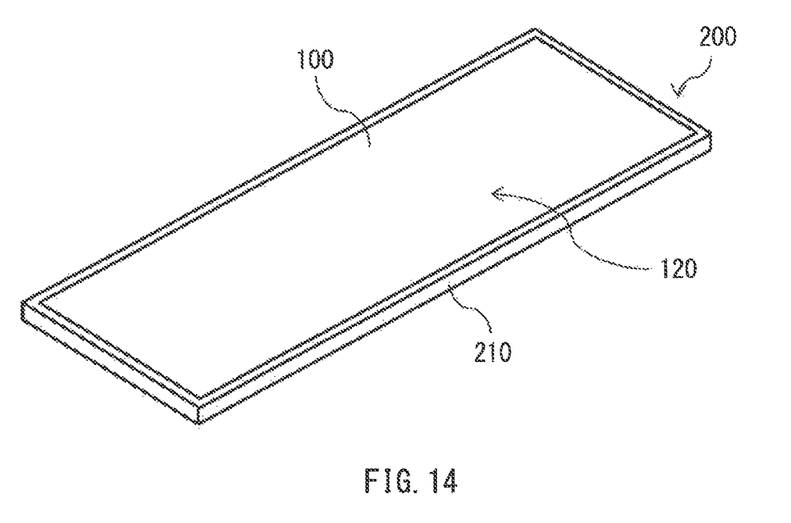
FIG. 14 is a perspective view of an outer appearance of an application example of the display unit according to the embodiment and the modification example thereof.

FIG. 14 perspectively illustrates an outer appearance of an electronic apparatus 200 according to the present application example. The electronic apparatus 200 may be, for example, a sheet-like personal computer provided with a display surface on a main surface of a casing 210. The electronic apparatus 200 may be provided with the display unit 100 according to any of the foregoing embodiment and the modification examples on the display surface of the electronic apparatus 200. The display unit 100 may be disposed to allow the protective sheet 120 to face outward. In the present application example, the display unit 100 is provided with the protective sheet 120, thus making it possible to achieve the electronic apparatus 200 which is light-weighted and is less likely to be cracked.

Further, in the present application example, when the display unit 100 is provided also with the protective sheet 140, it becomes possible to achieve the electronic apparatus 200 with less warp or flexure.

Although the disclosure has been described hereinabove by way of example with reference to the embodiment, the modification examples, and the application example, the disclosure is not limited thereto but may be modified in a wide variety of ways. Moreover, the effects described hereinabove are mere examples. The effects according to an embodiment of the disclosure are not limited to those described hereinabove. The disclosure may further include other effects in addition to the effects described hereinabove.

Moreover, the disclosure may also have the following configurations.

(1)

A display unit including:
a display panel having a light-emitting surface; and
a first protective sheet provided on the light-emitting surface, the first protective sheet including
  a first impact dispersion layer having a pencil hardness of 3H or higher,
  a first strain relaxation layer having flexural strength and tensile strength both higher than the flexural strength and the tensile strength of the first impact dispersion layer, and
  a gel-like first impact absorption layer having a thickness of a submillimeter order or more, the first impact absorption layer, the first strain relaxation layer, and the first impact dispersion layer being arranged in this order from the light-emitting surface.

(2) The display unit according to (1), wherein the first impact absorption layer includes a gel-like bonding layer having an Asker C hardness of 30 or more and 80 or less, the gel-like bonding layer joining the first protective sheet directly or indirectly to the light-emitting surface.

(3) The display unit according to (2), wherein the first impact absorption layer is made of an acrylic gel-like adhesive.

(4) The display unit according to any one of (1) to (3), wherein the display panel includes a flexible panel.

(5) The display unit according to any one of (1) to (4), wherein the display panel includes an organic EL panel.

(6) The display unit according to any one of (1) to (5), wherein the first protective sheet includes one of a polarizing plate and a touch panel between the light-emitting surface and the first impact absorption layer, the touch panel including a transparent wiring line.

(7) The display unit according to any one of (1) to (4), wherein the first strain relaxation layer includes one of a polarizing plate and a touch panel, the touch panel including a metal wiring line.

(8) The display unit according to any one of (1) to (7), further including a second protective sheet provided on a rear surface of the display panel, the second protective sheet including
a second impact dispersion layer having a pencil hardness of 3H or higher,
a second strain relaxation layer having flexural strength and tensile strength both higher than the flexural strength and the tensile strength of the second impact dispersion layer, and
a gel-like second impact absorption layer having a thickness of a submillimeter order or more,
the second impact absorption layer, the second strain relaxation layer, and the second impact dispersion layer being arranged in this order from the rear surface.

(9) An electronic apparatus provided with a display unit, the display unit including:
a display panel having a light-emitting surface; and
a first protective sheet provided on the light-emitting surface, the first protective sheet including
a first impact dispersion layer having a pencil hardness of 3H or higher,
a first strain relaxation layer having flexural strength and tensile strength both higher than the flexural strength and the tensile strength of the first impact dispersion layer, and
a gel-like first impact absorption layer having a thickness of a submillimeter order or more,
the first impact absorption layer, the first strain relaxation layer, and the first impact dispersion layer being arranged in this order from the light-emitting surface.

(10) A protective sheet that protects a light-emitting surface of a display panel, the protective sheet including:
a first impact dispersion layer having a pencil hardness of 3H or higher;
a first strain relaxation layer having flexural strength and tensile strength both higher than the flexural strength and the tensile strength of the first impact dispersion layer; and
a gel-like first impact absorption layer having a thickness of a submillimeter order or more,
the first impact absorption layer, the first strain relaxation layer, and the first impact dispersion layer being arranged in this order.

According to the protective sheet, the display unit, and the electronic apparatus of one embodiment of the disclosure, the impact absorption layer provided below the impact dispersion layer are made of the gel-like resin layer having a thickness of a submillimeter order or more. This allows the impact absorption layer to be deformed in accordance with a curvature generated in the impact dispersion layer when the impact dispersion layer receives impact, thus making it possible to absorb the external impact. Note that it is not possible for the bonding layer having thin thickness provided merely for the purpose of adhesion to have such a function. Further, according to one embodiment of the disclosure, the strain relaxation layer having flexural strength and tensile strength both higher than the flexural strength and the tensile strength of the impact dispersion layer is provided between the impact dispersion layer and the impact absorption layer. This makes it possible to reduce the possibility that the impact dispersion layer may exceed flexural fracture strain to be cracked even when the very soft impact absorption layer is provided below the impact dispersion layer.

According to the protective sheet, the display unit, and the electronic apparatus of one embodiment of the disclosure, the impact absorption layer provided below the impact dispersion layer is made of the gel-like resin layer having a thickness of a submillimeter order or more. Further, the strain relaxation layer having flexural strength and tensile strength both higher than the flexural strength and the tensile strength of the impact dispersion layer is provided between the impact dispersion layer and the impact absorption layer. Thus, it becomes possible to absorb the external impact while suppressing the occurrence of a crack without using the toughened glass. It is to be noted that the foregoing technical contents are mere examples of the disclosure. The effects according to an embodiment of the disclosure are not limited to those described hereinabove. The disclosure may have effects different from those described above, or may further have other effects in addition to those described above.

It should be understood by those skilled in the art that various modifications, combinations, sub-combinations, and alterations may occur depending on design requirements and other factors insofar as they are within the scope of the appended claims or the equivalents thereof.

What is claimed is:

1. A display unit comprising:
a display panel having a light-emitting surface; and
a first protective sheet provided on the light-emitting surface, the first protective sheet including
a gel-like first impact absorption layer having a thickness of a submillimeter order or more, and comprising a gel-like bonding layer having an Asker C hardness of 30 or more and 80 or less, the gel-like bonding layer joining the first protective sheet directly or indirectly to the light-emitting surface,
a first strain relaxation layer,
a first impact dispersion layer having a pencil hardness of 3H or higher, the first strain relaxation layer having a flexural strength and a tensile strength both higher than the flexural strength and the tensile strength of the first impact dispersion layer, and the first impact absorption layer, the first strain relaxation layer, and the first impact dispersion layer being arranged in this order from the light-emitting surface.

2. The display unit according to claim 1, wherein the first impact absorption layer is made of an acrylic gel-like adhesive.

3. The display unit according to claim 1, wherein the display panel comprises a flexible panel.

4. The display unit according to claim 3, wherein the display panel comprises an organic EL panel.

5. The display unit according to claim 4, wherein the first protective sheet includes one of a polarizing plate and a touch panel between the light-emitting surface and the first impact absorption layer, the touch panel including a transparent wiring line.

6. The display unit according to claim 4, wherein the first strain relaxation layer comprises one of a polarizing plate and a touch panel, the touch panel including a metal wiring line.

7. The display unit according to claim 3, further comprising a second protective sheet provided on a rear surface of the display panel, the second protective sheet including
 a second impact dispersion layer having a pencil hardness of 3H or higher,
 a second strain relaxation layer having flexural strength and tensile strength both higher than the flexural strength and the tensile strength of the second impact dispersion layer, and
 a gel-like second impact absorption layer having a thickness of a submillimeter order or more,
 the second impact absorption layer, the second strain relaxation layer, and the second impact dispersion layer being arranged in this order from the rear surface.

8. An electronic apparatus provided with a display unit, the display unit comprising:
 a display panel having a light-emitting surface; and
 a first protective sheet provided on the light-emitting surface, the first protective sheet including
  a gel-like first impact absorption layer having a thickness of a submillimeter order or more, and comprising a gel-like bonding layer having an Asker C hardness of 30 or more and 80 or less, the gel-like bonding layer joining the first protective sheet directly or indirectly to the light-emitting surface,
  a first strain relaxation layer, and
  a first impact dispersion layer having a pencil hardness of 3H or higher, the first strain relaxation layer having a flexural strength and a tensile strength both higher than the flexural strength and the tensile strength of the first impact dispersion layer,
 the first impact absorption layer, the first strain relaxation layer, and the first impact dispersion layer being arranged in this order from the light-emitting surface.

9. A protective sheet that protects a light-emitting surface of a display panel, the protective sheet comprising:
 a gel-like first impact absorption layer having a thickness of a submillimeter order or more and comprising a gel-like bonding layer having an Asker C hardness of 30 or more and 80 or less, the gel-like bonding layer joining the first protective sheet directly or indirectly to the light-emitting surface;
 a first strain relaxation layer; and
 a first impact dispersion layer having a pencil hardness of 3H or higher, the first strain relaxation layer having a flexural strength and a tensile strength both higher than the flexural strength and the tensile strength of the first impact dispersion layer,
 the first impact absorption layer, the first strain relaxation layer, and the first impact dispersion layer being arranged in this order.

* * * * *